(12) United States Patent
Takaba

(10) Patent No.: US 9,721,803 B2
(45) Date of Patent: Aug. 1, 2017

(54) ETCHING METHOD FOR SUBSTRATE TO BE PROCESSED AND PLASMA-ETCHING DEVICE

(71) Applicant: TOKYO ELECTRON LIMITED, Tokyo (JP)

(72) Inventor: Hiroyuki Takaba, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/390,217

(22) PCT Filed: Apr. 10, 2013

(86) PCT No.: PCT/JP2013/060852
§ 371 (c)(1),
(2) Date: Oct. 2, 2014

(87) PCT Pub. No.: WO2013/168509
PCT Pub. Date: Nov. 14, 2013

(65) Prior Publication Data
US 2015/0118858 A1  Apr. 30, 2015

(30) Foreign Application Priority Data
May 8, 2012 (JP) ................................. 2012-106586

(51) Int. Cl.
*H01L 21/302* (2006.01)
*H01L 21/461* (2006.01)
(Continued)

(52) U.S. Cl.
CPC ...... *H01L 21/3065* (2013.01); *H01J 37/3244* (2013.01); *H01J 37/32192* (2013.01);
(Continued)

(58) Field of Classification Search
None
See application file for complete search history.

(56) References Cited

U.S. PATENT DOCUMENTS

| | | | |
|---|---|---|---|
| 7,416,989 B1* | 8/2008 | Liu | H01L 21/02063 438/706 |
| 2003/0098291 A1* | 5/2003 | Yeom | C23F 4/00 216/63 |
| 2006/0154486 A1* | 7/2006 | Balasubramaniam et al. | 438/706 |
| 2011/0139748 A1* | 6/2011 | Donnelly | H01J 37/32036 216/37 |
| 2012/0048831 A1* | 3/2012 | Rueger | H01J 37/32009 216/67 |
| 2012/0186521 A1* | 7/2012 | Iwasaki | C23C 16/45517 118/723 AN |
| 2013/0023125 A1* | 1/2013 | Singh | H01L 21/3065 438/706 |

(Continued)

FOREIGN PATENT DOCUMENTS

| | | |
|---|---|---|
| JP | 3-263827 A | 11/1991 |
| JP | 4-137532 A | 5/1992 |
| WO | 2011/034057 * | 3/2011 |

OTHER PUBLICATIONS

International Search Report mailed Jun. 18, 2013 in PCT/JP2013/060852.

(Continued)

*Primary Examiner* — Stephanie Duclair
(74) *Attorney, Agent, or Firm* — Rothwell, Figg, Ernst & Manbeck, P.C.

(57) ABSTRACT

In one embodiment of the present invention, an etching method for a substrate to be processed comprises: (a1) a step in which etchant gas is supplied into a processing container than accommodates a substrate to be processed; (b1) a step in which the inside of the processing container is evacuated; (c1) a step in which a noble gas is supplied into the processing container; and (d1) a step in which microwaves are supplied into the processing container so as to excite the plasma of the noble gas inside the processing container. The sequential process including the step of supplying the etchant of supplying the etchant gas, the evacuating step, the step of supplying the noble gas, and the step of exciting the plasma of the noble gas may be repeated.

7 Claims, 11 Drawing Sheets

(51) Int. Cl.
*B44C 1/22* (2006.01)
*C03C 15/00* (2006.01)
*C03C 25/68* (2006.01)
*C23F 1/00* (2006.01)
*H01L 21/3065* (2006.01)
*H01L 21/311* (2006.01)
*H01L 21/3213* (2006.01)
*H01J 37/32* (2006.01)
*H01L 21/67* (2006.01)

(52) U.S. Cl.
CPC .. *H01J 37/32449* (2013.01); *H01J 37/32926* (2013.01); *H01L 21/31116* (2013.01); *H01L 21/32137* (2013.01); *H01L 21/67069* (2013.01); *H01J 2237/334* (2013.01)

(56) References Cited

U.S. PATENT DOCUMENTS

2013/0137267 A1* 5/2013 Chang ................ H01J 37/3244
438/694

OTHER PUBLICATIONS

Yoshinobu Aoyagi, et al., "Molecular layer etching of GaAs," Applied Physics Letter 60 (8), Feb. 24, 1992 (pp. 968-970) (3 pages).

* cited by examiner

ETCHING METHOD FOR SUBSTRATE TO BE PROCESSED AND PLASMA-ETCHING DEVICE

CROSS REFERENCE TO RELATED APPLICATION

This application is a 35 U.S.C. 371 National Phase Entry Application from PCT/JP2013/060852, filed Apr. 10, 2013, which claims priority to Japanese Patent Application No. 2012-106586, filed May 8, 2012, the disclosures of which are incorporated herein in their entirety by reference.

TECHNICAL FIELD

An exemplary embodiment of the present disclosure relates to an etching method for a substrate to be processed and a plasma etching device.

BACKGROUND

In manufacturing a semiconductor device, various processings such as, for example, film forming and etching, are performed on a substrate to be processed so as to form a fine pattern. Such a pattern formed on a substrate to be processed tends to be finer and finer and thus, a control of an etching amount in the order of several nm or less is requested.

An atomic layer etching (ALE) method receives attention as a technology for controlling such an etching amount. The ALE method is a technology of etching a substrate to be processed to an atomic layer level by causing an etchant gas to be adsorbed on the substrate to be processed, and then, generating plasma of an inert gas such as, for example, Ar gas. For example, Patent Document 1 discloses a technology based on such an ALE method.

PRIOR ART DOCUMENT

Patent Document

Patent Document 1: Specification of US Patent Application Publication No. 2012/0048831A

SUMMARY OF INVENTION

Problems to be Solved

In the technology disclosed in Patent Document 1, the ALE method is carried out using a parallel flat plate type plasma etching device. However, in the ALE method using the parallel flat plate type plasma etching device, the etching amount may not be precisely controlled, or a substrate to be processed may be damaged.

Accordingly, what is requested in the related art is an etching method based on an ALE method which may reduce damage to the substrate to be processed and is excellent in controllability of etching amount.

Solution

An aspect of the present disclosure relates to an etching method for a substrate to be processed. The method includes: (a1) supplying an etchant gas into a processing container that accommodates a substrate to be processed; (b1) evacuating the inside of the processing container; (c1) supplying a noble gas into the processing container; and (d1) supplying microwaves into the processing container so as to excite plasma of the nobble gas inside the processing container. In an exemplary embodiment, a series of steps including the supplying of the etchant gas, the evacuating, the supplying of the noble gas, and the exciting of the plasma of the noble gas may be repeated.

Here, in a parallel flat plate type plasma etching device, the electronic temperature of the plasma within the processing container becomes higher than 2 eV to 3 eV. The plasma with this electronic temperature may cut a bond between the etchant gas adsorbed on the substrate to be processed and the substrate to be processed. Thus, it is estimated that the etching amount is difficult to control in the ALE method using the parallel flat plate type plasma etching device. In addition, the substrate to be processed may be damaged in the plasma having such a high electronic temperature.

Meanwhile, the method according to the aspect of the present invention uses microwaves for exciting plasma. The plasma excited using the microwaves has a considerably low electronic temperature which is, for example, 1 eV to 2 eV. The plasma having such a low electronic temperature does not have an energy to break a bond between an etchant gas chemically adsorbed to a substrate to be processed and the substrate to be processed. In the present method, it is possible to separate constituent atoms of the substrate to be processed which form the bond with the etchant gas from the substrate to be processed by heat generated due to the activation of the noble gas, without breaking the bond. Because the present method does not break the bond between the etchant gas and the constituent atoms of the substrate to be processed, the method is excellent in controllability of etching amount. In addition, according to the present method, the plasma having an electronic temperature lower than that of plasma excited by the parallel flat plate type plasma etching device is excited. Thus, the damage to the substrate to be processed may also be reduced.

In an exemplary embodiment, the substrate to be processed may include a polycrystalline silicon layer. In such a case, the etchant gas may be $Cl_2$ gas. In the present exemplary embodiment, the $Cl_2$ gas is chemically adsorbed to silicon in the polycrystalline silicon. A binding energy between chlorine and silicon is higher than a binding energy of Si—Si in the polycrystalline silicon layer. Thus, according to the present exemplary embodiment, it is possible to separate the silicon which forms a bond with Cl (chlorine) from the polycrystalline silicon layer by the heat generated due to the activation of the noble gas, without breaking the bond.

In addition, a plasma etching device according to another aspect of the present disclosure includes a processing container, a first supply unit, an exhaust unit, a second supply unit, a microwave supply unit, and a control unit. The first supply unit supplies an etchant gas to inside of the processing container. The exhaust unit evacuates the inside of the processing container. The second supply unit supplies a noble gas to the inside of the processing container. The microwave supply unit supplies microwaves to the inside of the processing container. The control unit controls the first supply unit, the exhaust unit, the second supply unit, and the microwave supply unit such that (a1) the etchant gas is supplied into the processing container, then (b1) the inside of the processing container is evacuated, then (c1) the noble gas is supplied to the inside of the processing container, and then (d1) the microwaves are supplied to the inside of the processing container so as to excite the plasma of the noble gas. The plasma etching device may be used so as to perform the above-described etching method of a substrate to be processed in which microwaves are used for exciting plasma. In an exemplary embodiment, the control unit may control the first supply unit, the exhaust unit, the second supply unit, and the microwave supply unit to repeat a series of processings including steps (a1) to (d1) as described above.

In addition, in an exemplary embodiment, the first supply unit may supply $Cl_2$ gas as the etchant gas. When such an etchant gas is supplied, it is possible to etch a substrate to be processed which includes a polycrystalline silicon layer, as the substrate to be processed.

In addition, still another aspect of the present disclosure relates to an etching method for a substrate to be processed. The method includes: (a2) supplying a noble gas into a processing container that accommodates a substrate to be processed and supplying microwaves so as to excite plasma; and (b2) alternately increasing and decreasing a supply amount of an etchant gas in relation to the inside of the processing chamber that accommodates the substrate to be processed, in a period of exciting the plasma. In an exemplary embodiment, in the alternate increasing and decreasing of the supply amount of the etchant gas, supply of the etchant gas and supply stop of the etchant gas may be alternately switched.

The present method may control the etching rate of each cycle of increasing and decreasing the supply amount of the etchant gas to be relatively small. In addition, when the number of times of performing the cycle is adjusted, the etching amount may be controlled. Accordingly, the present method is excellent in controllability of etching amount.

In an exemplary embodiment, the substrate to be processed may include polycrystalline silicon and silicon nitride. In such a case, the etchant gas may include $CH_3F$ gas. According to this exemplary embodiment, it becomes possible to selectively etching the silicon nitride in relation to the polycrystalline silicon.

In addition, a plasma etching device according to yet another aspect of the present disclosure includes a processing container, a first supply unit, a second supply unit, a microwave supply unit, and a control unit. The first supply unit supplies an etchant gas into the processing container. The second supply unit supplies a noble gas into the processing container. The microwave supply unit supplies microwaves into the processing container. The control unit controls the first supply unit, second supply unit and the microwave supply unit to alternately increase and decrease a supply amount of the etchant gas in relation to the inside of the processing container, in a period of (a2) supplying the microwaves and (b2) exciting plasma. The plasma etching device may be used for performing a method including the above-mentioned steps (a2) and (b2) in which microwaves are used for exciting plasma. In an exemplary embodiment, the control unit may alternately switch supply of the etchant gas and supply stop of the etchant gas in order to increase and decrease of a supply amount of the etchant gas.

In an exemplary embodiment, the first supply unit may supply a gas including $CH_3F$ gas as the etchant gas. The device of the present exemplary embodiment may be used for etching a substrate to be processed which includes polycrystalline silicon and silicon nitride, and may selectively etching the silicon nitride on the substrate to be processed.

Effect of Invention

As described above, according to various aspects, and exemplary embodiments of the present disclosure, there is provided an etching method based on an ALE method which may reduce damage to the substrate to be processed and is excellent in controllability of etching amount. And, there is provided a plasma etching apparatus that may be used to perform the etching method.

DETAILED DESCRIPTION TO EXECUTE INVENTION

Hereinafter, various exemplary embodiments will be described with reference to drawings. For the same or corresponding elements in each of the drawings will be denoted by the same symbols.

Figure 1:
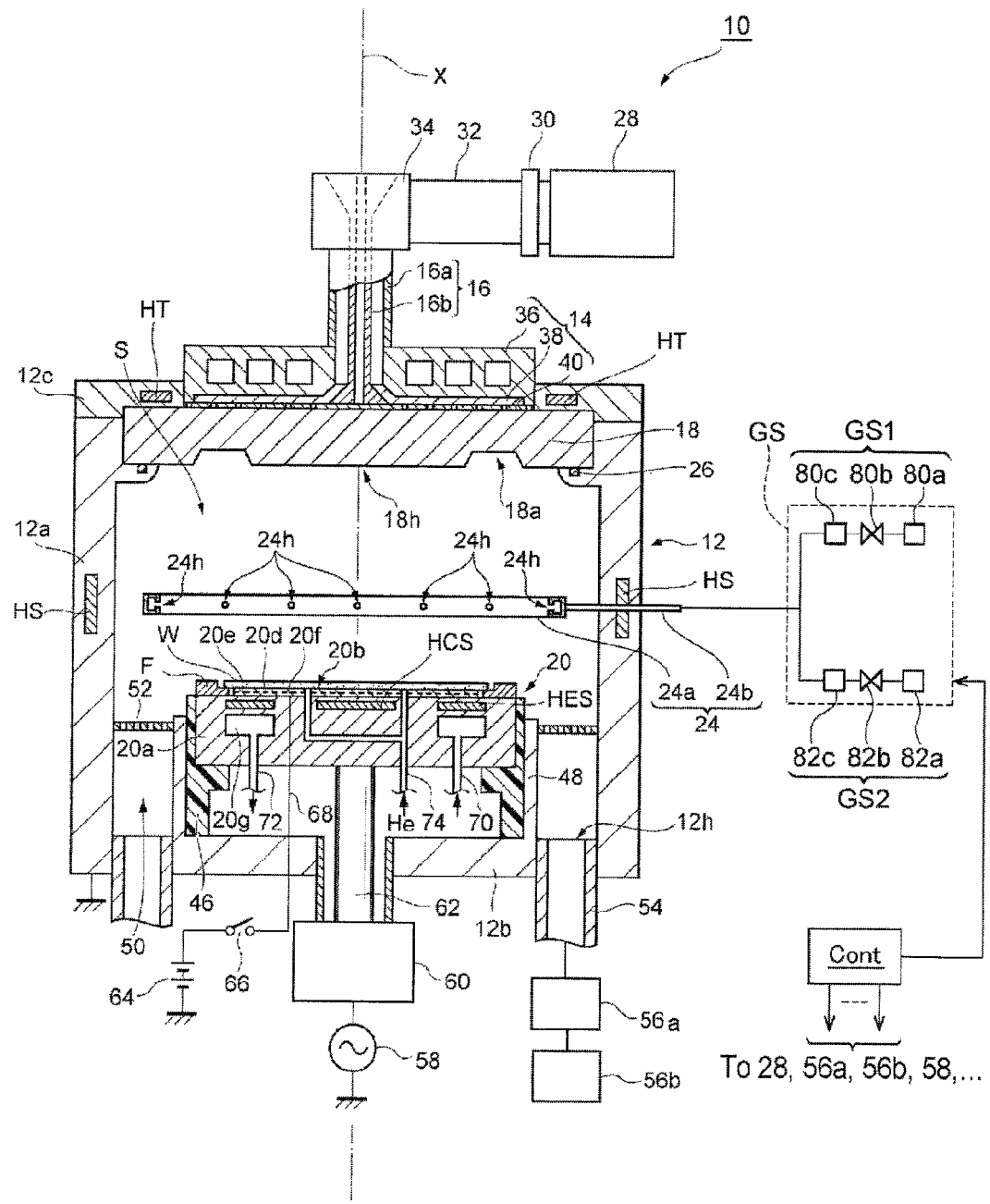
FIG. 1 is a cross-sectional view schematically illustrating a plasma etching device according to an exemplary embodiment.

First, a plasma etching device which may perform an etching method according an exemplary embodiment will be described. FIG. 1 is a cross-sectional view schematically illustrating a plasma etching device according to an exemplary embodiment. The plasma etching device 10 illustrated in FIG. 1 is provided with a processing container 12.

The processing container 12 defines a processing space S configured to accommodate a substrate to be processed W. The processing container 12 may include a side wall 12a, a bottom portion 12b, and a ceiling portion 12c. The side wall 12a has a substantially cylindrical shape extending in a direction where an axis X extends (hereinafter, referred to as an "axis X direction"). The bottom portion 12b is formed at a lower end side of the side wall 12a. The bottom portion 12b is formed with an exhaust hole 12h for evacuation. An upper end of the side wall 12a is opened. The upper end opening of the side wall 12a is closed by a dielectric window 18. The dielectric window 18 is sandwiched between the upper end of the side wall 12a and the ceiling portion 12c. A sealing member 26 may be interposed between the dielectric window 18 and the upper end of the side wall 12a. The sealing member 26 is, for example, an O-ring, and contributes to the sealing of the processing container 12.

The plasma etching device 10 further includes a stage 20 provided in the processing container 12. The stage 20 is provided under the dielectric window 18. In an exemplary embodiment, the stage 20 includes a table 20a and an electrostatic chuck 20b.

The table 20a is supported on a cylindrical support 46. The cylindrical support 46 is made of an insulative material, and extends vertically upward from the bottom portion 12b. In addition, a conductive cylindrical support 48 is provided on the outer circumference of the cylindrical support 46. The cylindrical support 48 extends vertically upward along the outer circumference of the cylindrical support 46. An annular exhaust path 50 is formed between the cylindrical support 48 and the side wall 12a.

An annular baffle plate 52 which is formed with a plurality of through holes is attached above the exhaust path 50. The exhaust path 50 is connected to an exhaust pipe 54 that provides an exhaust hole 12h, and an exhaust device 56b is connected to the exhaust pipe 54 through a pressure regulator 56a. The exhaust device 56b includes a vacuum pump such as, for example, a turbo molecular pump. The pressure regulator 56a adjusts an exhaust amount of the exhaust device 56b so as to regulate the pressure within the processing container 12. A processing space S within the processing container 12 may be decompressed to a desired vacuum degree through the pressure regulator 56a and the exhaust device 56b. In addition, when the exhaust device 56b is operated, the processing gas may be exhausted from the outer circumference of the stage 20 through the exhaust path 50.

The table 20a also serves as a high frequency electrode. A high frequency power source 58 for RF bias is electrically connected to the table 20a through a matching unit 60 and a power feeding rod 62. The high frequency power source 58 outputs a high frequency power having a predetermined frequency which is suitable for controlling an energy of ions drawn in the substrate to be processed W, for example, 13.65 MHz, with a predetermined power. The matching unit 60 accommodates a matcher configured to match a high frequency power source 58 side impedance, mainly an electrode and plasma, and a load side impedance such as, for example, the processing container 12. A blocking condenser for generating self-bias is included in the matcher.

An electrostatic chuck 20b is provided on the top surface of the table 20a. In an exemplary embodiment, the top surface of the electrostatic chuck 20b provides a mounting region on which the substrate to be processed W is mounted. The electrostatic chuck 20b holds the substrate to be processed W by electrostatic attracting force. A focus ring F is provided radially outside the electrostatic chuck 20b to surround the periphery of the substrate to be processed W in an annular shape. The electrostatic chuck 20b includes an electrode 20d, an insulative film 20e, and an insulative film 20f. The electrode 20d is made of a conductive film and provided between the insulative film 20e and the insulative film 20f. A direct current (DC) power source 64 is electrically connected to the electrode 20d through a switch 66 and a coated wire 68. The electrostatic chuck 20b may attract and hold the substrate to be processed W on the top surface thereof by Coulomb force generated by the DC current applied from the DC power source 64.

An annular coolant chamber 20g is provided inside the table 20a to extend in a circumferential direction. A coolant having a predetermined temperature, for example, cooling water may be supplied in circulation to the coolant chamber 20g through pipes 70, 72 from a chiller unit. The processing temperature of the substrate to be processed W on the electrostatic chuck 20b may be controlled by the temperature of the coolant. In addition, a heat transfer gas from a heat transfer gas supply unit, for example, He gas, is supplied to a gap between the top surface of the electrostatic chuck 20b and the rear surface of the substrate to be processed W through a gas supply tube 74.

In an exemplary embodiment, the plasma etching device 10 may further include heaters HT, HS, HCS, and HES as a temperature control mechanism. The heater HT is installed within the ceiling portion 12c and extends in an annular shape to surround the antenna 14. In addition, the heater HS is installed within the side wall 12a and extends in an annular shape. The heater HS may be installed at a position corresponding to, for example, an intermediate portion of the processing space S in a height direction (i.e., the axis X direction). The heater (HCS) is installed within the table 20a. The heater HCS is installed below the central portion of the above-described mounting region, i.e. a region intersecting with the axis X within the table 20a. In addition, the HES is installed within the table 20a and extends in an annular shape to surround the heater HCS. The heater HES is installed below the outer peripheral edge of the above-described mounting region.

In addition, the plasma etching device 10 may further include an antenna 14, a coaxial waveguide 16, a dielectric window 18, a microwave generator 28, a tuner 30, a waveguide 32, and a mode converter 34. The microwave generator 28 generates microwaves with a frequency of, for example, 2.45 GHz. The microwave generator 28 is connected to an upper portion of the coaxial waveguide 16 through the tuner 30, the waveguide 32, and the mode converter 34. The coaxial waveguide 16 extends along the axis X which is the central axis thereof. The coaxial waveguide 16 includes an outer conductor 16a and an inner conductor 16b. The outer conductor 16a has a cylindrical shape extending in the axis X direction. The lower end of the outer conductor 16a may be electrically connected to an upper portion of the cooling jacket 36 which has a conductive surface. The inner conductor 16b is provided inside the outer conductor 16a. The inner conductor 16b extends along the axis X. The lower end of the inner conductor 16b is connected to a slot plate 40 of the antenna 14.

In an exemplary embodiment, the antenna 14 may be disposed in an opening formed in the ceiling portion 12c. The antenna 14 includes a dielectric plate 38 and a slot plate 40. The dielectric plate 38 shortens a wavelength of microwaves, and is substantially disc-shaped. The dielectric plate 38 is made of, for example, quartz or alumina. The dielectric plate 38 is sandwiched between the slot plate 40 and the bottom surface of the cooling jacket 36. Accordingly, the antenna 14 may be configured by the dielectric plate 38, the slot plate 40, and the bottom surface of the cooling jacket 36.

Figure 2:
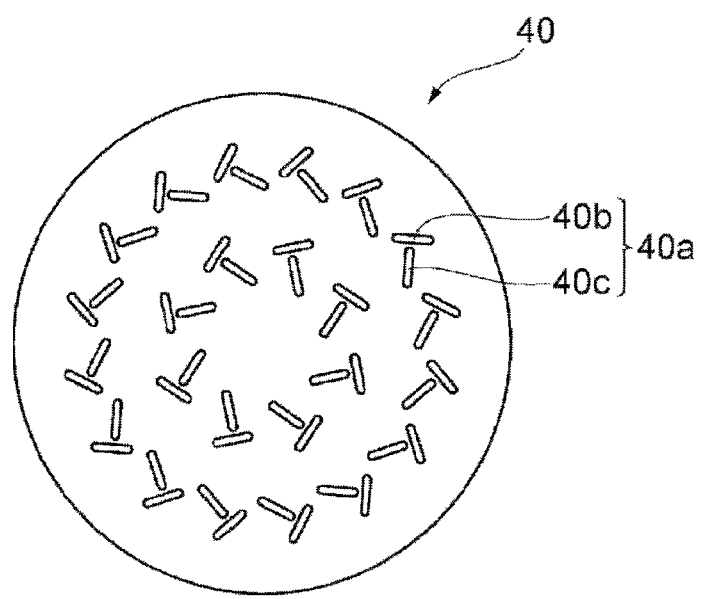
FIG. 2 is a plan view illustrating a slot plate according to an exemplary embodiment.

The slot plate 40 is a substantially disc-shaped metal plate in which a plurality of slot pairs is formed. In an exemplary embodiment, the antenna 14 may be a radial line slot antenna. FIG. 2 is a plan view illustrating an exemplary slot plate illustrated in FIG. 1. A plurality of slot pairs 40a is formed in the slot plate 40. The plurality of slot pairs 40a is provided at predetermined intervals in a radial direction, and also arranged at predetermined intervals in a circumferential direction. Each of the plurality slot pairs 40a includes two slots 40b and 40c. The slot 40b and the slot 40c extend in directions where they intersect with each other or are orthogonal to each other.

FIG. 1 is referred to again. In the plasma etching device 10, microwaves generated by the microwave generator 28 are propagated to the dielectric plate 38 through the coaxial waveguide 16, and provided to the dielectric window 18 through the slots of the slot plate 40.

The dielectric window 18 is substantially disc-shaped, and made of, for example, quartz or alumina. The dielectric window 18 is installed just below the slot plate 40. The dielectric window 18 transmits the microwaves received from the antenna 14 so that the microwaves are introduced into the processing space S. As a result, an electric field is generated just below the dielectric window 18, and plasma is generated within the processing space. With this plasma etching device 10, plasma may be generated using the microwaves without applying a magnetic field.

In an exemplary embodiment, the bottom surface of the dielectric window 18 defines a concave portion 18a. The concave portion 18a is formed annularly around the axis X and has a taper shape. The concave portion 18a is formed so as to facilitate generation of standing waves by the introduced microwaves and may contribute to efficient generation of plasma by the microwaves. In addition, the antenna 14, the dielectric window 18, the coaxial waveguide 16, the microwave generator 28, the tuner 30, the waveguide 32, and the mode converter 34 constitute a microwave supply unit according to an exemplary embodiment.

In addition, the plasma etching device 10 further includes an inlet 24 and a gas supply system GS. The inlet 24 includes an annular tube 24a and a pipe 24b. The annular tube 24a is provided within the processing container 12 to extend in an annular shape around the axis X at an intermediate position of the processing space S in the axis X direction. A plurality of gas injection holes 24h opened toward the axis X is formed in the annular tube 24a. The plurality of gas injection holes 24h is arranged annularly around the axis X. The pipe 24b is connected to the annular tube 24a, and the pipe 24b extends to the outside of the processing container 12. Such an inlet 24 introduces a processing gas into the processing space S toward the axis X through the pipe 24b, the annular tube 24a, and the gas injection hole 24h.

The gas supply system GS includes a gas supply source GS1 and a gas supply source GS2. The gas supply source GS1 and the gas supply source GS2 supply gases to the inlet 24. The gas supply source GS1 includes a gas source 80a, a valve 80b, and a mass flow controller 80c. The gas source 80a is a gas source of an etchant gas (in an exemplary embodiment, $Cl_2$ gas). The gas source 80a is connected to the inlet 24 through the valve 80b and the mass flow controller 80c. In addition, the inlet 24 and the gas supply source GS1 constitutes a first supply unit in an exemplary embodiment.

The gas supply source GS2 includes a gas source 82a, a valve 82b, and a mass flow controller 82c. The gas source 82a is a gas source of a noble gas, and in an exemplary embodiment, a gas source of Ar gas. The gas source 82a is connected to the inlet 24 through the valve 82b and the mass flow controller 82c. In addition, the inlet 24 and the gas supply source GS2 constitute a second supply unit in an exemplary embodiment.

In addition, as illustrated in FIG. 1, the plasma etching device 10 may further include a control unit Cont. The control unit Cont may be a programmable controller such as, for example, a computer device. The control unit Cont may transmit a control signal, to the mass flow controllers 80c and 82c so as to control flow rates of the gases from the gas sources 80a and 82a. In addition, the control unit Cont may transmit a control signal to the valves 80b and 82b so as to control opening/closing of the valves. Further, the control unit Cont may supply a control signal to the microwave generator 28, the high frequency power source 58, and the pressure regulator 56a so as to control the microwave power, RF bias power, and ON/OFF, and the pressure within the processing container 12.

In addition, the control unit Cont may cause the gas supply source GS1 to supply the etchant gas to the processing container 12, then cause the exhaust device 56b to evacuate the inside of the processing container 12, then cause the gas supply source GS2 to supply the noble gas into the processing container 12, then cause microwave generator 28 to generate microwaves in the processing container 12 so as to excite plasma of the noble gas, and then cause the exhaust device 56b to evacuate the inside of the processing container 12. The control unit Cont may repeat a series these controls by a predetermined number of times. As a result, the plasma etching device 10 may perform atomic layer etching (ALE) on the substrate to be processed (W).

Figure 3:
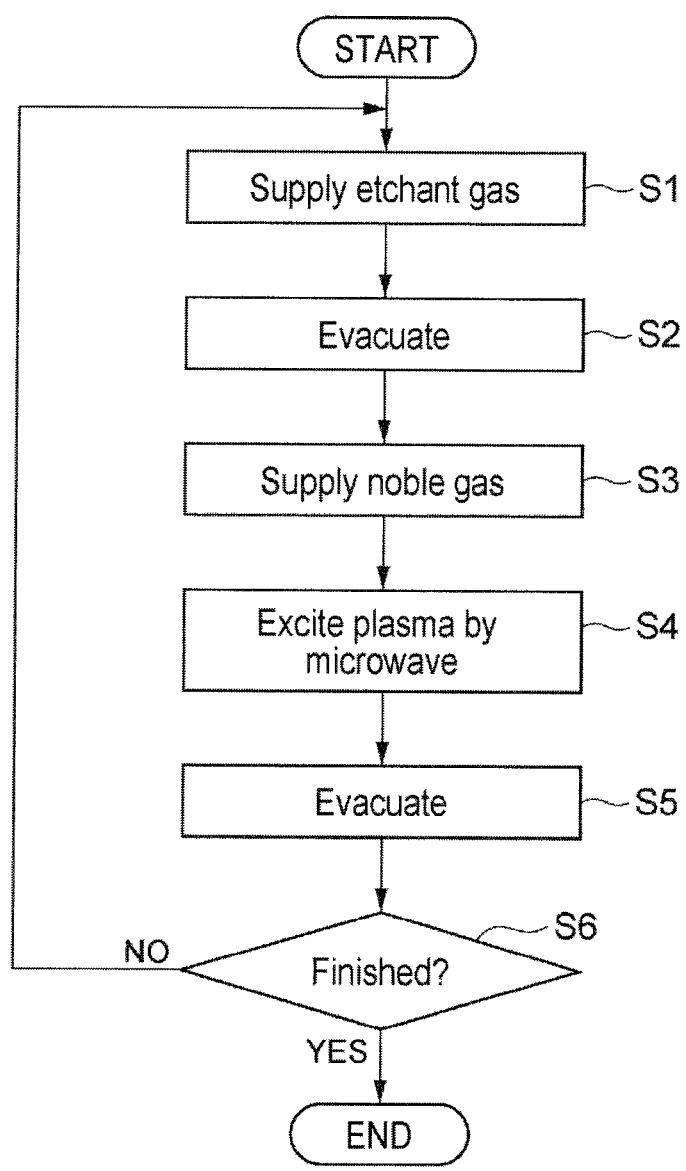
FIG. 3 is a flowchart illustrating an etching method according to an exemplary embodiment.

Hereinafter, an etching method which may be performed using the plasma etching device 10 will be described with reference to FIG. 3 and FIGS. 4A to 4E. FIG. 3 is a flowchart illustrating an etching method according to an exemplary embodiment. In addition, FIGS. 4A to 4E are views for describing a concept of the etching method illustrated in FIG. 3.

Figure 4A:
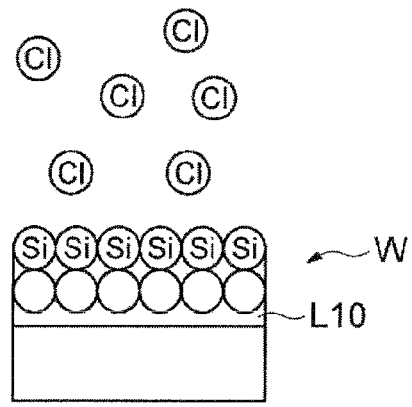
FIGS. 4A to 4E are views for describing a principle of the etching method illustrated in FIG. 3.

As illustrated in FIG. 3, in the etching method according to the exemplary embodiment, in step S1, an etchant gas is supplied into the processing container 12 in a state where a substrate to be processed W is mounted on the stage 20. As illustrated in FIG. 4A, the substrate to be processed W may include, for example, a polycrystalline silicon layer as an etched layer L10, and, for example, $Cl_2$ gas may be supplied as an etchant gas. In addition, in FIG. 4A, a circle surrounding a mark "Si" indicates a Si atom, and a circle surrounding a mark "Cl" indicates a molecule of $Cl_2$ gas. By step S1, the etchant gas is adsorbed on a surface of the substrate to be processed W.

Figure 4D:
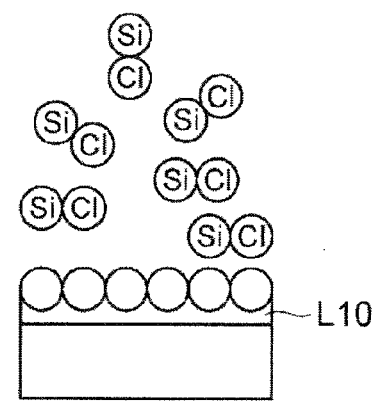
Figure 4B:
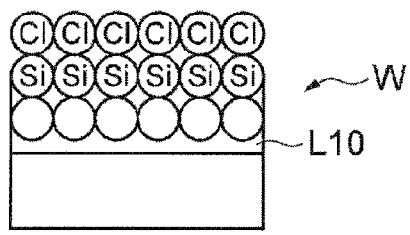

Subsequently, in the present method, evacuation of the inside of the processing container 12 is performed in step S2. As illustrated in FIG. 4B, the etchant gas chemically adsorbed to the atoms on the surface of the substrate to be processed W remains, and the etchant gas excessively adsorbed to the substrate to be processed W and the etchant gas within the processing space S are removed from the processing container 12.

Subsequently, in the present method, in step S3, a noble gas is supplied into the processing container 12. As illustrated in FIG. 4C, as for the noble gas, for example, Ar gas may be used. In addition, in FIG. 4C, a circle surrounding a mark "Ar" indicates an Ar atom. Subsequently, in the present method, in step S4, microwaves are supplied into the processing container 12 so as to excite plasma of the noble gas. By step S4, the atoms of the surface of the substrate to be processed W which form bonds with chlorine are released from the substrate to be processed W, as illustrated in FIG. 4D.

Figure 4E:
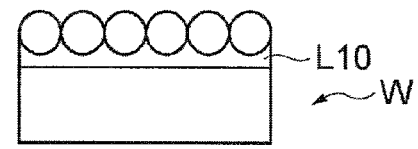
Figure 4C:
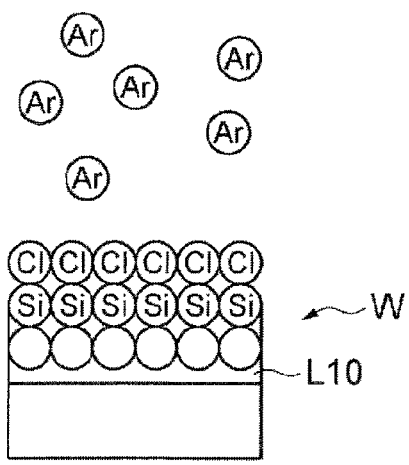

Subsequently, in the present method, in step S5, the inside of the processing container 12 is evacuated as illustrated in FIG. 4E. The present method may perform a series of processings including steps S1 to S5 as described above a predetermined number of times. In addition, in step S6, when it is determined that the series of processings should be finished, for example, when it is determined that the series of processings has performed the predetermined number of times, the present method is finished.

In the above-described etching method, the plasma of the noble gas is excited using microwaves after the etchant gas is chemically adsorbed to the surface of the substrate to be processed W and the inside of the processing container 12 is evacuated. The electron temperature of the plasma is, for example, 1 eV to 2 eV which is lower than the electron temperature of plasma generated in a parallel flat plate type plasma etching device. The plasma with the low electron temperature does not have an energy that cuts bonds between the atoms on the surface of the substrate to be processed W and constituent molecules or atoms of the etchant gas. The present method separates the constituent atoms of the substrate to be processed W which form bonds with the constituent atoms or molecules of the etchant gas, from the substrate to be processed W by the heat generated by the activation of the noble gas without cutting the bonds.

For example, when the substrate to be processed W includes a polycrystalline silicon layer as an etched layer L10 and $Cl_2$ gas is supplied as an etchant gas, the plasma excited by the present method does not have an energy that cuts bonds between Si atoms and chlorine molecules or atoms. The present method separates the Si atoms of the etched layer L10 which form bonds with chlorine molecules or atoms, from the substrate to be processed W by the heat generated by the activation of the noble gas without cutting the bonds.

As described above, because the present method is capable of separating the constituent atoms of the substrate to be processed W which form bonds with the constituent atoms or molecules of the etchant gas, from the substrate to be processed W without cutting the bonds, the present method is excellent in controllability of etching amount.

Hereinafter, test examples of etching using the plasma etching device 10 will be described.

Test Example 1

Figure 5A:
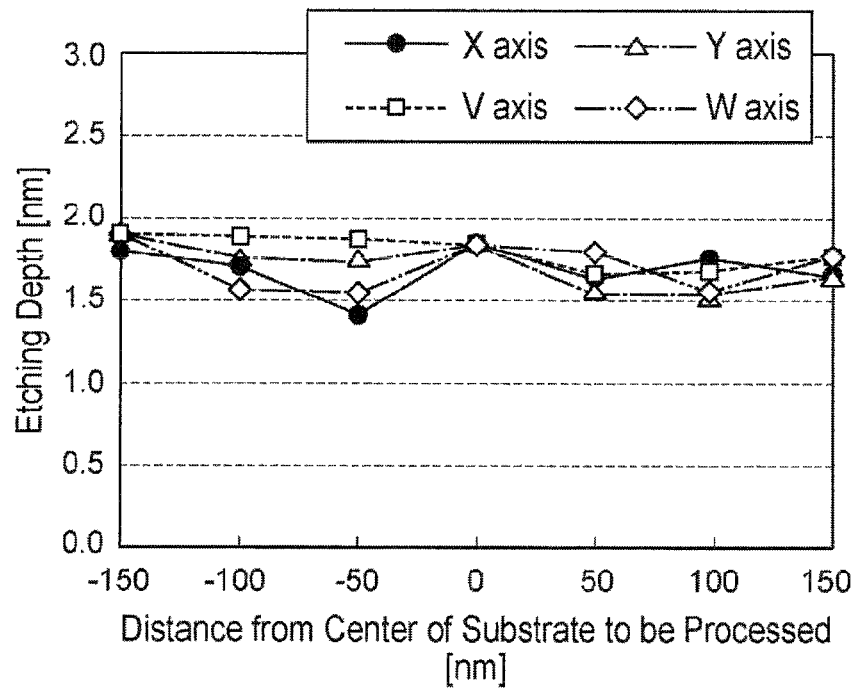
FIGS. 5A and 5B are views representing results of Test Example 1.
Figure 5B:
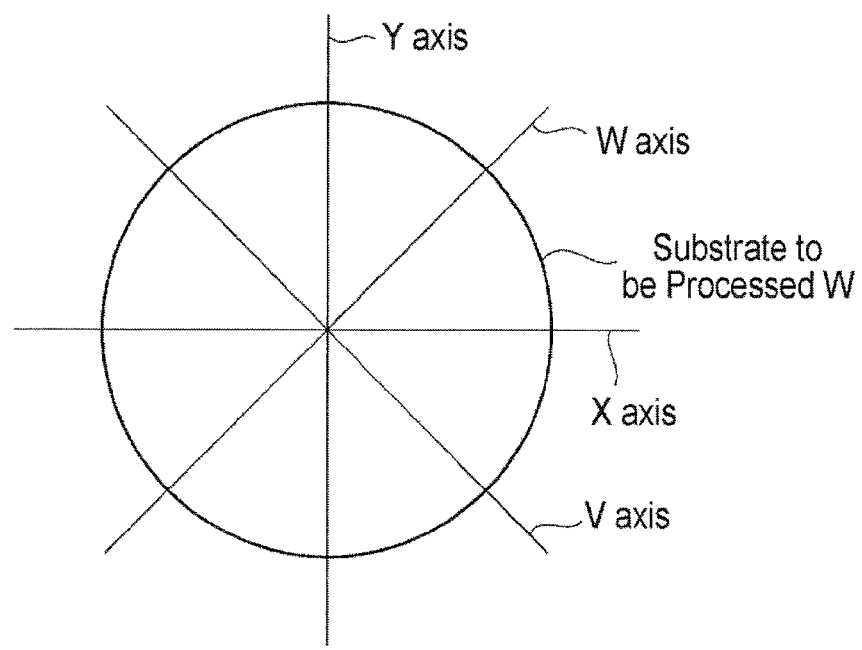

In Test Example 1, a polycrystalline silicon layer on a substrate to be processed W having a diameter of 300 mm was etched as an etched layer L10 using the plasma etching device 10. Conditions in Test Example 1 are as follows.
Pressure within the processing container 12 in steps S1, S3 and S4: 100 mTorr (13.33 Pa)
Microwave power in step S4: 1000 W
RF bias power in step S4: 0 W
Flow rate of etchant gas ($Cl_2$ gas) in step S1: 200 sccm
Flow rate of noble gas (Ar gas) in steps S3 and S4: 1000 sccm
Processing time in step S1: 30 sec
Processing time in step S4: 30 sec
Number of times of repeating steps S1 to S5: 40 times In Test Example 1, etching depths of the etched layer L10 by the etching performed under the above-described conditions were measured on each of X, V, Y, and W axes (see, e.g., FIG. 5B) which pass the center of the substrate to be processed W at 45 degree intervals. The results are represented in FIG. 5A. In FIG. 5A, the horizontal axis represents a distance from the center of the substrate to be processed, and the vertical axis represents an etching depth. As is apparent from FIG. 5A, it was founded that when the above-described ALE method is performed using the plasma etching device 10, a polycrystalline silicon layer may be etched. In addition, in Test Example 1, etching depths in one cycle including steps S1 to S5 were 0.0432 nm on the average. From this, it was found that when the ALE method is performed using the plasma etching device 10, the etching amount of the polycrystalline silicon layer may be precisely controlled.

Test Examples 2 and 3

Figure 6A:
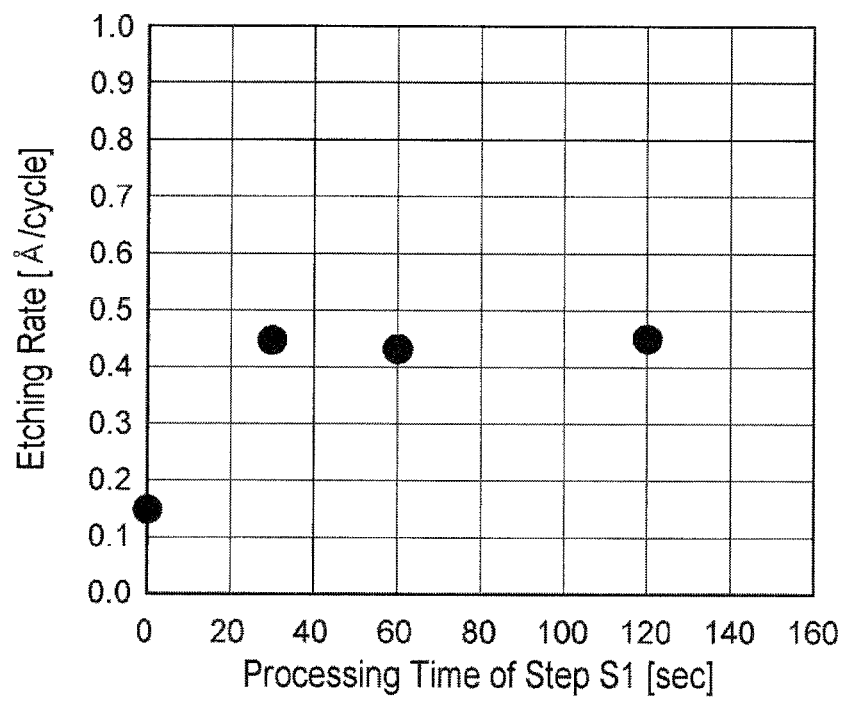
FIGS. 6A and 6B are views representing results of Test Examples 2 and 3.
Figure 6B:
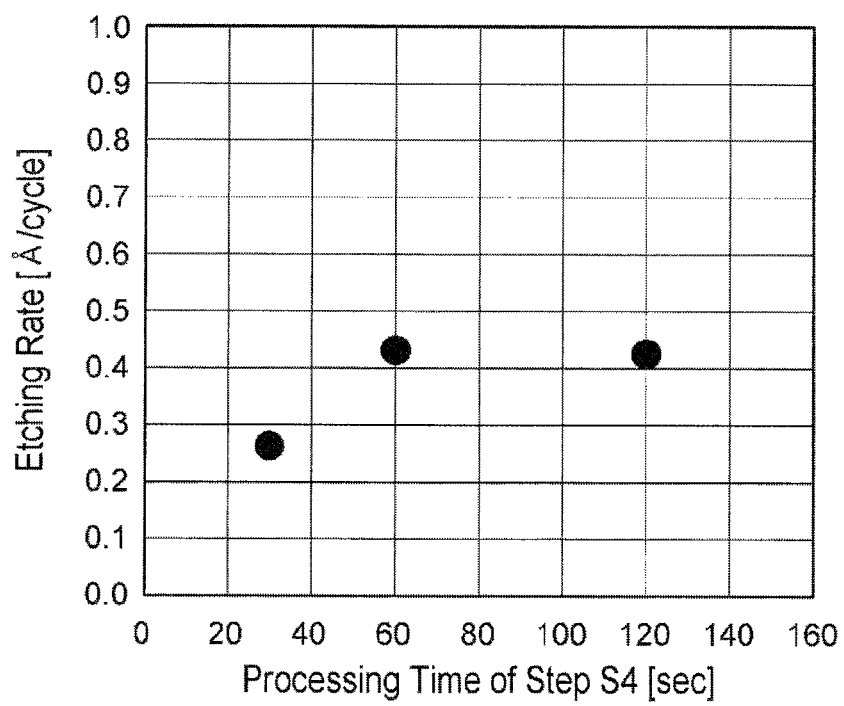

In Test Example 2, a polycrystalline silicon layer on a substrate to be processed W having a diameter of 300 mm was etched as an etched layer L10 using the plasma etching device 10 with the processing time in step S1 as a variable parameter. Conditions in Test Example 2 are as follows.
Pressure within the processing container 12 in steps S1, S3 and S4: 100 mTorr (13.33 Pa)
Microwave power in step S4: 1000 W
RF bias power in step S4: 0 W
Flow rate of etchant gas ($Cl_2$ gas) in step S1: 200 sccm
Flow rate of noble gas (Ar gas) in steps S3 and S4: 1000 sccm
Processing time in step S4: 60 sec
Number of times of repeating steps S1 to S5: 40 times In Test Example 3, a polycrystalline silicon layer on a substrate to be processed W having a diameter of 300 mm was etched as an etched layer L10 using the plasma etching device 10 with the processing time in step S4 as a variable parameter. Conditions in Test Example 3 are as follows.
Pressure within the processing container 12 in steps S1, S3 and S4: 100 mTorr (13.33 Pa)
Microwave power in step S4: 1000 W
RF bias power in step S4: 0 W
Flow rate of etchant gas ($Cl_2$ gas) in step S1: 200 sccm
Flow rate of noble gas (Ar gas) in steps S3 and S4: 1000 sccm
Processing time in step S1: 60 sec
Number of times of repeating steps S1 to S5: 40 times In each of Test Examples 2 and 3, the etching rates during one cycle including steps S1 to S5 were calculated from the etching depths of the etched layer L10. The etching rates obtained in each of Test Examples 2 and 3 are represented in FIGS. 6A and 6B. The horizontal axis of the graph illustrated in FIG. 6A represents a time of S1, i.e. a time of exposing the substrate to be processed W to $Cl_2$ gas, and the vertical axis represents an etching rate per one cycle. In addition, the horizontal axis of the graph illustrated in FIG. 6B represents a time of step S4, i.e. a time of exposing the substrate to be processed W to Ar plasma of, and the vertical axis represents an etching rate per one cycle.

As is apparent from FIG. 6A, according to Test Example 2, it was found that when the processing time in step S1 is a predetermined time or more, the etching rate of the etched layer L10 is saturated. In addition, as is apparent from FIG. 6B, according to Test Example 3, it was found that when the processing time in step S4 is a predetermined time or more, the etching rate of the etched layer L10 is saturated. From this, it was found that in the etching method using the plasma etching device 10, a self-limit exists in increase of an etching rate in relation to increase in the processing time in step S1 and the pressing time in step S4. That is, from the results of Test Examples 2 and 3, it was found that the above-described etching methods performed using the plasma etching device 10 satisfy the requirements of the ALE method.

Figure 7:
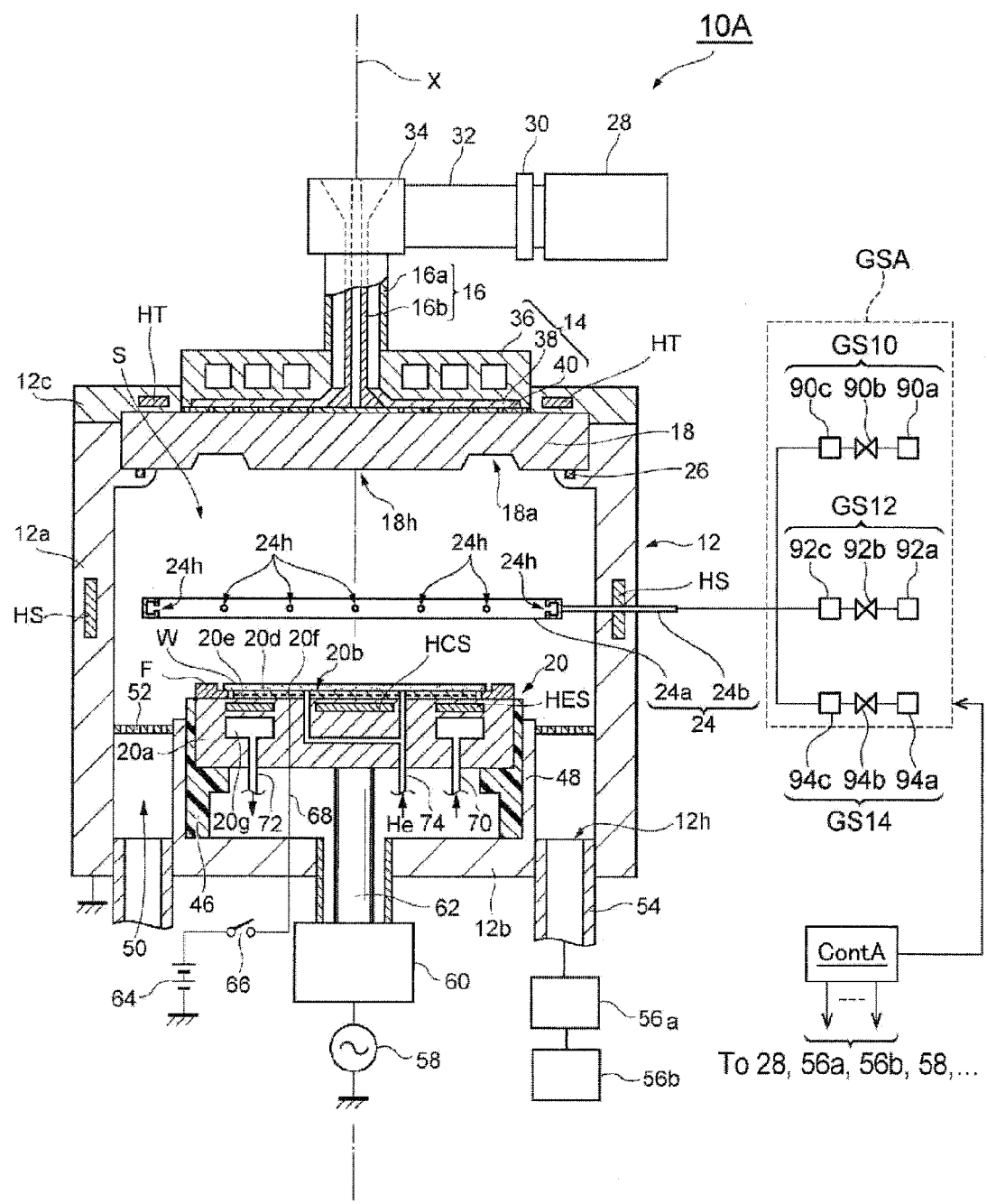
FIG. 7 is a cross-sectional view schematically illustrating a plasma etching device according to another exemplary embodiment.

Hereinafter, another exemplary embodiment will be described. FIG. 7 is a cross-sectional view schematically illustrating a plasma etching device according to another exemplary embodiment. The plasma etching device 10A illustrated in FIG. 7 is different from the plasma etching device 10 in that a gas supply system GSA is provided instead of the gas supply system GS and a control unit ContA is provided instead of the control unit Cont. Hereinafter, the gas supply system GSA and the control unit ContA will be described in detail.

The gas supply system GSA includes gas supply sources GS10, GS12. The gas supply sources GS10, GS12, GS14 supply gases to the inlet 24. The gas supply source GS10 includes a gas source 90a, a valve 90b, and a mass flow controller 90c. The gas source 90a is a gas source of a gas that forms a part of the etchant gas. In an exemplary embodiment, the gas source 90a is a gas source of $CH_3F$ gas. The gas source 90a is connected to the inlet 24 via the valve 90b and the mass flow controller 90c.

The gas supply source GS12 includes a gas source 92a, a valve 92b, and a mass flow controller 92c. The gas source 92a is a gas source of a gas that forms another part of the etchant gas. In an exemplary embodiment, the gas source 92a is a gas source of $O_2$ gas. The gas source 92a is connected to the inlet 24 via the valve 92b and the mass flow controller 92c. In addition, the gas supply source GS10, the gas supply source GS12, and the inlet 24 constitute a first supply unit according to the exemplary embodiment.

The gas supply source GS14 includes a gas source 94a, a valve 94b, and a mass flow controller 94c. The gas source 94a is a gas source of a noble gas. In an exemplary embodiment, the gas source 94a is a gas source of Ar gas. The gas source 94a is connected to the inlet 24 via the valve 94b and the mass flow controller 94c. In addition, the gas supply source GS14 and the inlet 24 constitute a second supply unit of the exemplary embodiment.

The control unit ContA may be a controller such as, for example, a programmable computer device. The control unit ContA may transmit a control signal to the mass flow controllers 90c, 92c, 94c so as to control flow rates of gases from the gas sources 90a, 92a, 92c. In addition, the control unit ContA may transmit a control signal to the valves 90b, 92b, 94b so as to control opening/closing of the valves. In addition, the control unit ContA may supply a control signal to the microwave generator 28, the high frequency power source 58, and the pressure regulator 56a so as to control a microwave power, an RF bias power, and ON/OFF, and a pressure within the processing container 12.

In addition, the control unit ContA causes the gas supply source GS14 to supply a noble gas, and causes the microwave generator 28 to generate microwaves so as to excite plasma within the processing container 12, and the control unit ContA controls the gas supply source GS14 and microwave generator 28, and the gas supply source GS10 and the gas supply source GS12 to alternately increase and decrease the flow rates of the etchant gases supplied from the gas supply source GS10 and the gas supply source GS12 in a period of exciting the plasma. In the exemplary embodiment, the control unit ContA controls the gas supply source GS10 and the gas supply source GS12 so as to alternately switch supply and supply stop of the etchant gases from the gas supply source GS10 and the gas supply source GS12 in the period of exciting the plasma in the processing container 12.

Figure 8:
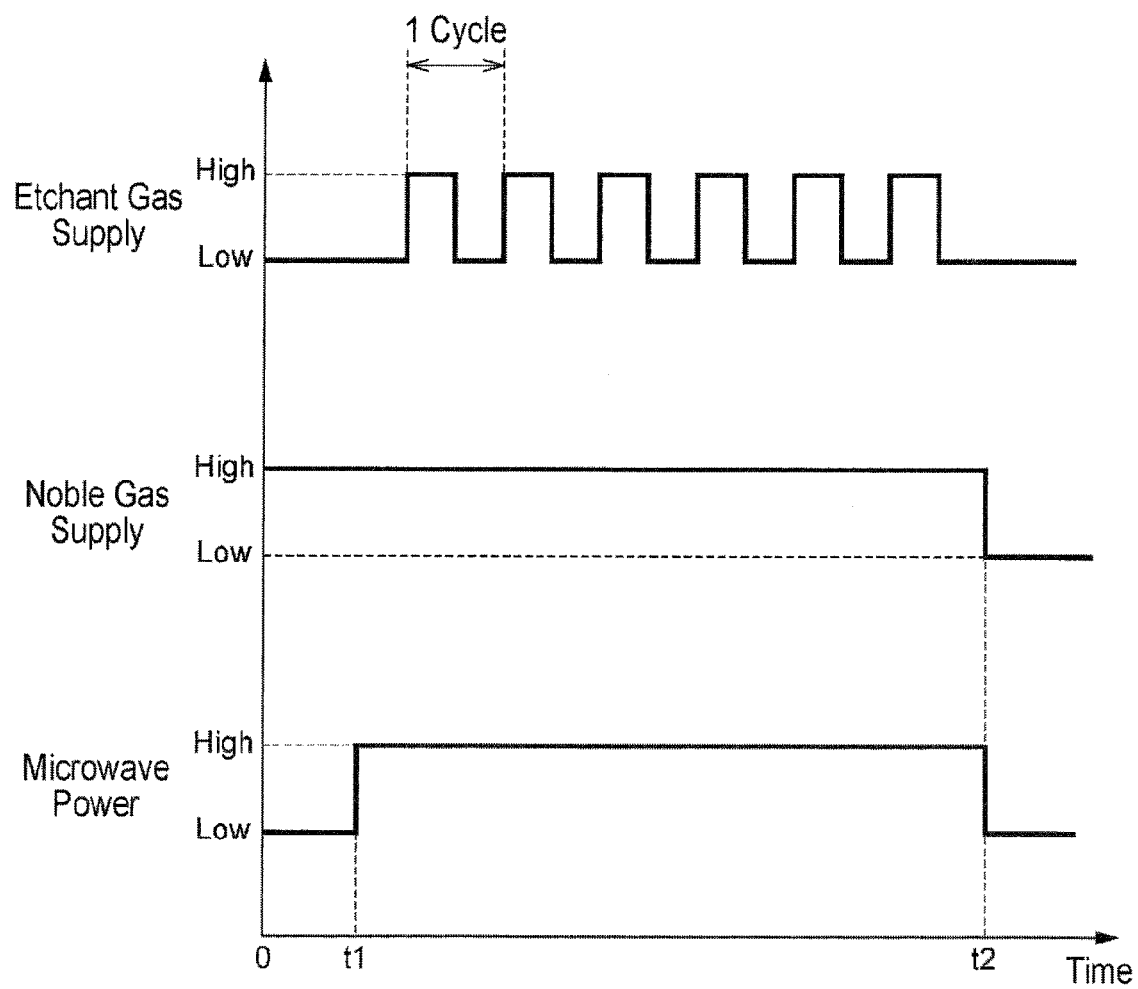
FIG. 8 is a timing chart representing an etching method according to another exemplary embodiment.

Hereinafter, an etching method which may be performed using the plasma etching device 10A will be described with reference to FIG. 8. FIG. 8 is a timing chart illustrating an etching method according to another exemplary embodiment. In FIG. 8, when an etchant gas supply level is "High", it represents that the etchant gas is supplied in the processing container 12, and when the etchant gas supply level is "Low", it represents that the flow rate of the etchant gas is reduced. In addition, when a noble gas supply level is "High", it represents that the noble gas is supplied in the processing container 12, and when the noble gas supply level is "Low", it represents that the flow rate of the noble gas is reduced. Further, when a microwave power level is "High", it represents that microwaves for exciting the plasma are supplied in the processing container 12, and when the microwave power level is "Low", it represents that the microwave power is reduced. In addition, in the following description, when the etchant gas supply level is "Low", it is assumed that the supply of the etchant gas is stopped, when the noble gas supply level is "Low", it is assumed that the supply of the noble gas is stopped, and when the microwave power level is "Low", it is assumed that the supply of microwaves is stopped.

In the etching method illustrated in FIG. 8, first, the gas supply source GS14 is caused to supply the noble gas into the processing container 12 by the control of the control unit ContA. In the present method, after the noble gas is supplied into the processing container 12, for example, at time t1, the microwave generator 28 is caused to generate microwaves by the control of the control unit ContA. As a result, the plasma is excited in the processing container 12. In addition, in the exemplary embodiment illustrated in FIG. 8, the supply of the noble gas and the supply of the microwaves are continued to time t2. That is, the plasma is excited in the processing container 12 during time t1 to time t2.

Subsequently, in the present method, in the period of exciting the plasma in the processing container 12, supply and supply stop of the etchant gases from the gas supply source GS10 and the gas supply source GS12 are alternately switched by the control of the control unit ContA. In the exemplary embodiment, a cycle including a one-time supply of etchant gases and a one-time supply stop of the etchant gases following the one-time supply has a time length of 60 sec, and the time length of each of the one-time supply of the etchant gases and the one-time supply stop of the etchant gases may be 30 sec.

In the present method, after the cycle is performed a predetermined number of times, and the supply of the noble gas and the supply of the microwaves are stopped, for example, at time t2. As a result, the present method is finished.

In such an etching method, the etching rate in the above-described one-time cycle is reduced and the etching amount is controlled by repeating the cycle. Since the present method may control the etching amount by the number of times of repeating the cycle as described above, the controllability of the etching amount is excellent.

According to the exemplary embodiment, the present etching method is capable of etching a substrate to be processed including polycrystalline silicon and silicon nitride, using a mixed gas of $CH_3F$ gas and $O_2$ gas as an etchant gas. When the mixed gas is used as the etchant gas, it becomes possible to selectively etch the silicon nitride on the substrate to be processed.

Hereinafter, descriptions will be made on test examples of etching using the plasma etching device 10A.

Test Examples 4 and 5

In Test Example 4, a polycrystalline silicon layer on a substrate to be processed W having a diameter of 300 mm was etched as an etched layer using the plasma etching device 10A. Conditions in Test Example 4 are as follows.
Flow rate of noble gas (Ar gas): 1000 sccm
Microwave power: 1000 W
RF bias power: 0 W
Supply amount of $CH_3F$ gas when supplying etchant gas: 8 sccm
Supply amount of $O_2$ gas when supplying etchant gas: 2 sccm
Supply time of etchant gas in 1 cycle: 30 sec
Supply stop time of etchant gas in 1 cycle: 30 sec
Number of times of repeating the cycle: 50 times
Temperature of heaters (HT and HS): 40° C.
Temperature of substrate to be processed: 40° C.

In Test Example 5, a silicon nitride layer on a substrate to be processed W having a diameter of 300 mm was etched as an etched layer using the plasma etching device 10A. Conditions in Test Example 5 are as follows.

Flow rate of noble gas (Ar gas): 1000 sccm
Microwave power: 1000 W
RF bias power: 0 W
Supply amount of $CH_3F$ gas when supplying etchant gas: 8 sccm
Supply amount of $O_2$ gas when supplying etchant gas: 2 sccm
Supply time of etchant gas in 1 cycle: 30 sec
Supply stop time of etchant gas in 1 cycle: 30 sec
Number of times of repeating the cycle: 50 times
Temperature of heaters (HT and HS): 40° C.
Temperature of substrate to be processed: 40° C.

Figure 9A:
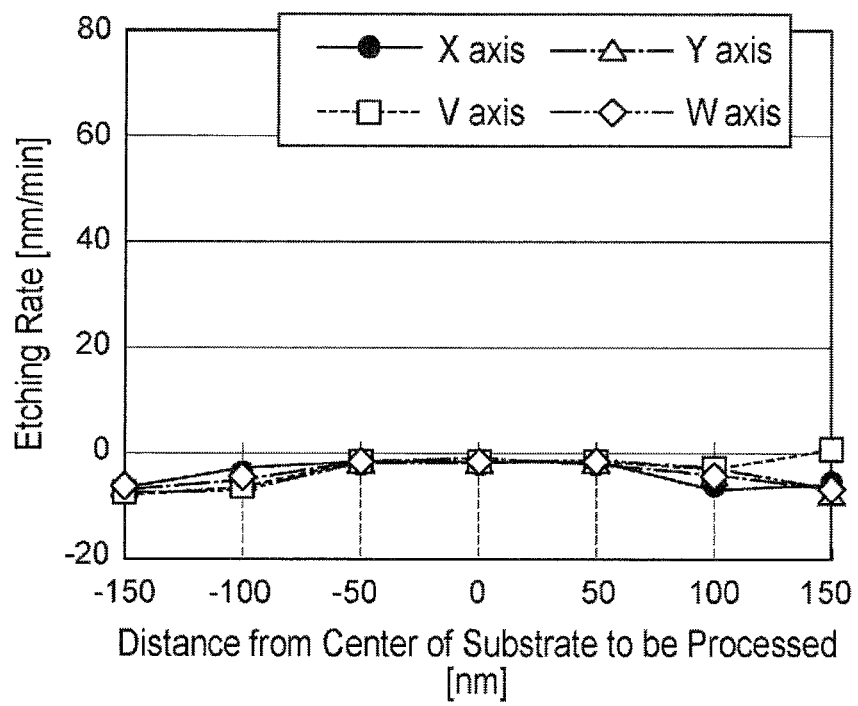
FIGS. 9A and 9B are views representing results of Test Examples 4 and 5.
Figure 9B:
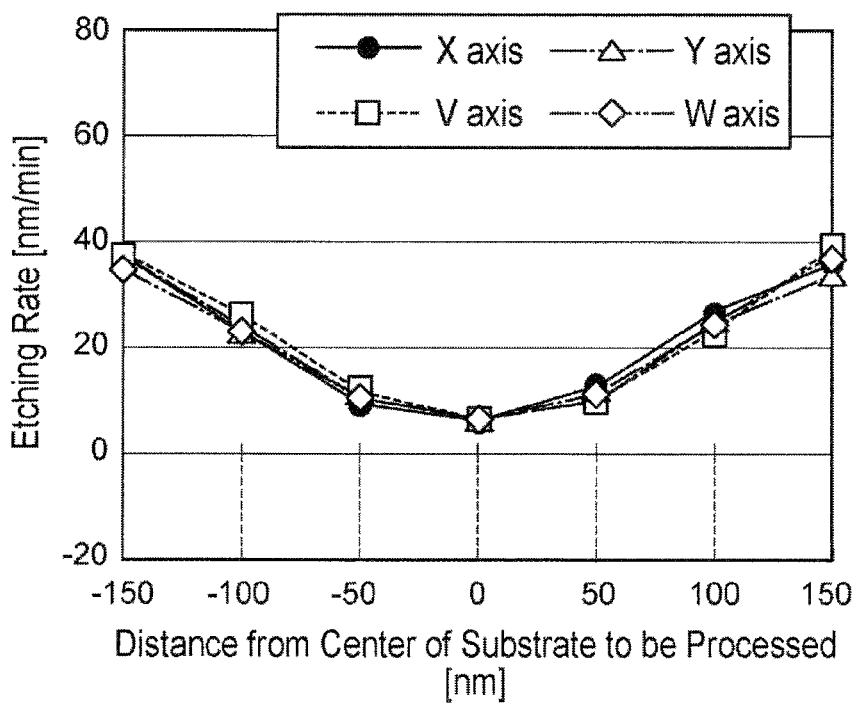

In Test Examples 4 and 5, etching depths of the etched layer were measured on each of X, V, Y, and W axes which pass the center of the substrate to be processed W at 45 degree intervals. In addition, etching rates on each axis in 1 cycle were calculated from the measured etching depths. FIG. 9A represents the etching rates obtained in Test Example 4, and FIG. 9B represents the etching rates obtained in Test Example 5. In FIGS. 9A and 9B, the horizontal axes represent a distance from the center of the substrate to be processed, and the vertical axes represent an etching rate.

As illustrated in FIG. 9A, it was found from Test Example 4 that when the mixed gas of $CH_3F$ gas and $O_2$ gas was used as the etchant gas, the etching rate of the polycrystalline silicon layer was 0 mm/min or less. In addition, as illustrated in FIG. 9B, it was found from Test Example 5 that when the mixed gas of $CH_3F$ gas and $O_2$ gas was used as the etchant gas, the etching rate of the silicon nitride is larger than 0 mm/min. Accordingly, it was found that when the substrate to be processed including silicon nitride and polycrystalline silicon etched while alternately switching the supply and the supply stop of the mixed gas of $CH_3F$ gas and $O_2$ gas, the silicon nitride can be selectively etched.

Test Examples 6 and 7

As illustrated in FIG. 9B, in Test Example 5 described above, the etching rate of the silicon nitride layer on the substrate to be processed was increased toward the edge of the substrate to be processed. Accordingly, Test Examples 6 and 7 were performed in order to determine whether the reason resulted from the etchant gas adhered to the side wall of the processing container 12 at the time of supply stop of the etchant gas. In Test Examples 6 and 7, the temperature of the heater HS was increased in order to increase the temperature of the side wall of the processing container 12 to be higher than that of the side wall in Test Examples 4 and 5 so as to reduce the adhesion of the etchant gas to the side wall. In addition, the temperature of the heater HT was also increased so as to increase the temperature of the upper portion of the processing container 12. Specifically, in Test Example 6, the temperature of the heaters HT and HS was set to 80° C. The other conditions in Test Example 6 are the same as those in Test Example 4. In addition, in Test Example 7, the temperature of the heaters HT and HS was set to 80° C. The other conditions in Test Example 7 are the same as those in Test Example 5.

Figure 10A:
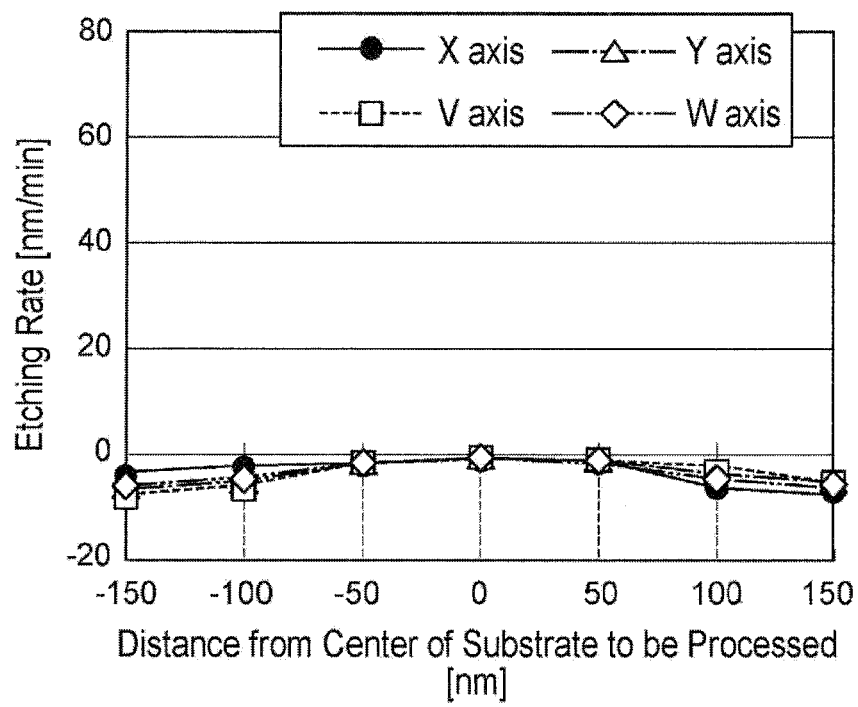
FIGS. 10A and 10B are views representing results of Test Examples 6 and 7.
Figure 10B:
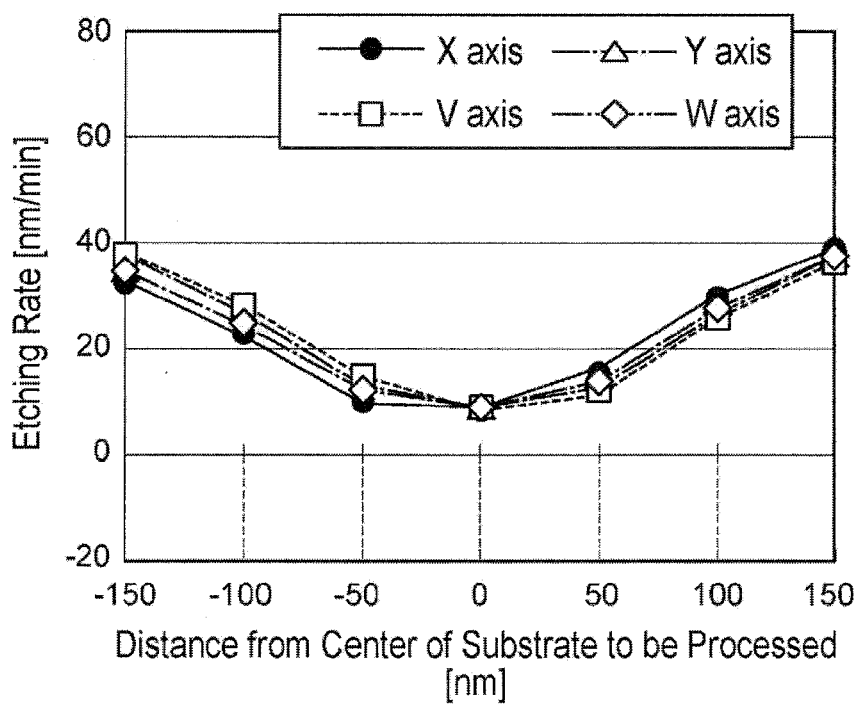

In Test Examples 6 and Test Example 7, the etching depths of the etched layer were also measured on each of X, V, Y, and W axes which pass the center of the substrate to be processed W at 45 degree intervals. In addition, etching rates on each axis in 1 cycle were calculated from the measured etching depths. FIG. 10A represents the etching rates obtained in Test Example 6, and FIG. 10B represents the etching rates obtained in Test Example 7. In FIGS. 10A and 10B, the horizontal axes represent a distance from the center of the substrate to be processed, and the vertical axes represent an etching rate.

As is obvious from comparison of FIGS. 10A and 10B and FIGS. 9A and 9B, it was found that even if the temperature of the side wall of the processing container 12 is increased, there is no change in etching rate value and distribution. That is, it was found that the reason why the etching rate of the silicon nitride layer is increased toward the edge does not result from the etchant gas adhered to the side wall of the processing container 12 at the time of supply stop of the etchant gas. Further, it is estimated that the etching rate distribution at respective positions on the substrate to be processed may be controlled when the spatial distribution of supply amount the etchant gas is controlled.

Although various exemplary embodiments have been described above, various modified aspects may be made without being limited to the above-described exemplary embodiments. For example, in the etching method illustrated in FIGS. 4A to 4E, $CF_4$ gas may be used instead of $Cl_2$ gas as the etchant gas when the etched layer is a SiN layer.

Figure 11:
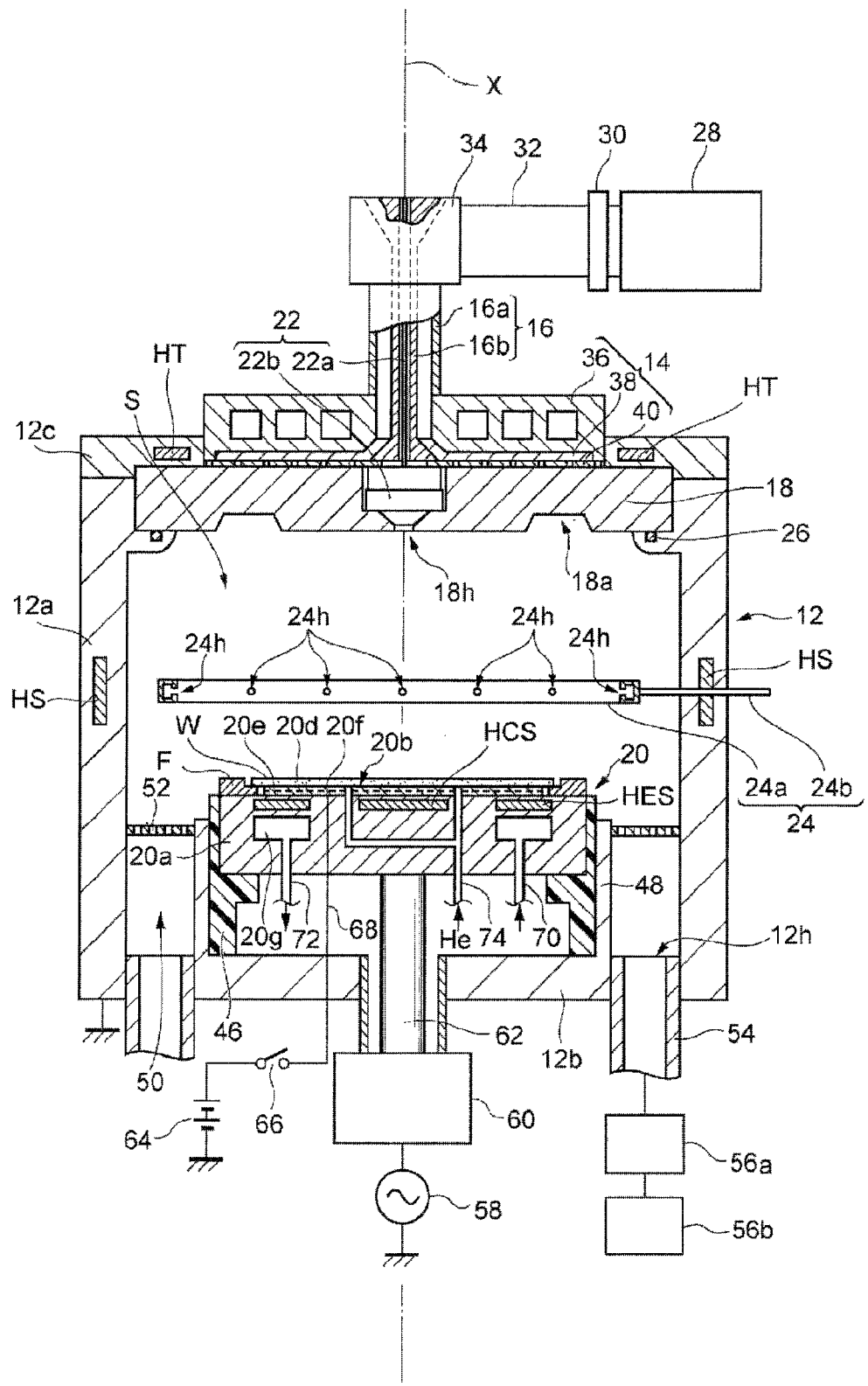
FIG. 11 is a cross-sectional view schematically illustrating a plasma etching device according to still another exemplary embodiment.

In addition, a gas may be supplied downward toward the substrate to be processed W from the central portion of the dielectric window 18 in the plasma etching device illustrated in FIGS. 1 and 7 in order to control the spatial distribution of the etchant gas supply amount. Specifically, as illustrated in FIG. 11, the central inlet 22 may be additionally provided in the plasma etching device illustrated in FIGS. 1 and 7. As illustrated in FIG. 11, the central inlet 22 includes a pipe 22a and an injector 22b. The pipe 22a extends through the inside of the inner conductor 16b along the axis X. The injector 22b is connected to the pipe 22a. A plurality of through holes extending in the axis X direction is formed in the injector 22b. In the dielectric window 18, a space that accommodates the injector 22b and a hole 18h that interconnects the space and the processing space S are formed along the axis X. The central inlet 22 may supply the gas into the processing space S along the axis X from the upper side of the processing space S through the pipe 22a, the plurality of through holes of the injector 22b, and the hole 18h. In the case of the plasma etching device 10, a separate gas supply system which is the same as the gas supply system GS may be connected to the central inlet 22. In addition, the gas from the gas supply system GS may be branched to the central inlet 22 through a flow splitter. In addition, in the case of the plasma etching device 10A, a separate gas supply system which is the same as the gas supply system GS10 may be connected to the central inlet 22. Further, the gas from the gas supply system GS may be branched to the central inlet 22 through a flow splitter. With this configuration, it becomes possible to independently control a spatial distribution and/or a composition ratio within the processing container 12.

DESCRIPTION OF SYMBOLS 10, 10A: plasma etching device, 12: processing container, 14: antenna, 16: coaxial waveguide, 18: dielectric window, 20: stage, 22: central inlet, 24: inlet (peripheral inlet), 28: microwave generator, 36: cooling jacket, 38: dielectric plate, 40: slot plate, 56a: pressure regulator, 56b: exhaust device, 58: high frequency power source, GS1: gas supply source (supply source of etchant gas), GS2: gas supply source

What is claimed is:

1. A method of etching a substrate to be processed, the method comprising:

supplying an etchant gas including $Cl_2$ gas into a processing container that accommodates the substrate including polycrystalline silicon, thereby allowing the etchant gas to be chemically adsorbed on a surface of the substrate;

after supplying the etchant gas, evacuating the inside of the processing container where the substrate is accommodated;

after evacuating the processing container, supplying a noble gas into the processing container where the substrate is accommodated; and after supplying the noble gas, generating heat by exciting plasma of the noble gas within the processing container where the substrate is accommodated after the etchant gas is chemically adsorbed on the surface of the substrate by supplying microwaves through a dielectric window into the processing container to activate the noble gas without (i) supplying an RF bias power to a stage supporting the substrate within the processing container and (ii) changing a temperature of the substrate, wherein atoms of the substrate that form bonds with atoms or molecules of the etchant gas are separated from a surface of the substrate by the heat generated from the activating of the noble gas without cutting the bonds formed between the atoms of the substrate and the atoms or molecules of the etchant gas.

2. The method of claim 1, wherein a series of processes including the supplying of the etchant gas, the evacuating, the supplying of the noble gas, and the exciting of the plasma of the noble gas is repeated.

3. The method of claim 1, wherein a microwave generator supplies the microwaves, wherein the microwaves are further supplied, to the stage, through an antenna containing a dielectric plate.

4. The method of claim 1, wherein, in the activating, a power of the microwave is 1000 W.

5. The method of claim 1, wherein a processing time of the activating is 30 sec or more.

6. A method of etching a substrate to be processed, the method comprising:

supplying an etchant gas including $CH_3F$ gas into a processing container that accommodates the substrate including polycrystalline silicon and silicon nitride, thereby allowing the etchant gas to be chemically adsorbed on a surface of the substrate;

supplying a noble gas into a processing container where the substrate is accommodated;

generating heat by exciting plasma of the noble gas within the processing container where the substrate is accommodated after the etchant gas is chemically adsorbed on the surface of the substrate by supplying microwaves through a dielectric window into the processing container to activate the noble gas without (i) supplying an RF bias power to a stage supporting the substrate within the processing container and (ii) changing a temperature of the substrate, wherein such that atoms of the substrate that form bonds with atoms or molecules of the etchant gas are separated from a surface of the substrate by the heat generated from the activating of the noble gas without cutting the bonds formed between the atoms of the substrate and the atoms or molecules of the etchant gas; and alternately increasing and decreasing a supply amount of the etchant gas in relation to an inside of the processing container in which the substrate is accommodated, in a period of exciting the plasma.

7. The method of claim 6, wherein in the alternately increasing and decreasing the supply amount of the etchant gas, supply of the etchant gas and supply stop of the etchant gas are alternately switched.

* * * * *